United States Patent [19]

Morin et al.

[11] 4,163,971

[45] Aug. 7, 1979

[54] SYSTEMS FOR DISPLAYING ANALOG VALUES

[75] Inventors: John O. Morin, Bedford; Joseph R. Mini, Abington, both of Mass.

[73] Assignee: Sigma Instruments Inc., Braintree, Mass.

[21] Appl. No.: 574,446

[22] Filed: May 5, 1975

[51] Int. Cl.² ............................................. G01D 7/00
[52] U.S. Cl. .................................... 340/754; 313/484; 313/217; 315/366; 340/773; 340/775; 340/789; 340/661
[58] Field of Search .............. 340/324 M, 324 R, 343; 315/169 R, 169 TV; 313/484, 494, 217

[56] References Cited

U.S. PATENT DOCUMENTS

| | | | |
|---|---|---|---|
| 3,474,438 | 10/1969 | Lauher | 340/324 A |
| 3,745,407 | 7/1973 | Day | 340/324 A |
| 3,775,764 | 11/1973 | Gaur | 340/324 R |
| 3,795,908 | 3/1974 | McDowell et al. | 340/324 M |
| 3,816,822 | 6/1974 | Auchapt | 340/324 M |
| 3,825,827 | 7/1974 | Tumbush | 324/122 X |
| 3,835,465 | 9/1974 | Tannas et al. | 340/324 R |
| 3,875,474 | 4/1975 | Ogle et al. | 315/169 TV |
| 3,898,642 | 8/1975 | Dorey et al. | 340/324 R |

Primary Examiner—David L. Trafton
Attorney, Agent, or Firm—Toren, McGeady and Stanger

[57] ABSTRACT

In the system disclosed a driving circuit repeatedly scans along a plurality of aligned electrodes in an enclosure filled with ionizable gas, by sequentially grounding the aligned electrodes and repeating the process cyclically. Within each cycle, a pulse width modulator energizes an anode opposite the electrodes for a period of time corresponding to an input value. Sequential glow discharges thus occur between the cathodes and the anode over a portion of the anode length. The discharges occur with sufficient rapidity so that they are observed as an illuminated portion of a bar formed by the electrodes. A second set of electrodes is scanned and an opposing anode energized to produce two illuminated bands separated from each other. Desired upper and lower set point limits for the input quantity determine the lengths of the bands and the separation between them. According to one embodiment, the separate bands are initiated from opposite ends of the bar formed by the electrode alignment with suitable reset cathodes. The driver forms one band from one end of the aligned electrodes and the other band from the other end of the aligned electrodes. According to another embodiment the space between the bands is formed by decreasing the anode current only enough to reduce the glow.

54 Claims, 6 Drawing Figures

SYSTEMS FOR DISPLAYING ANALOG VALUES

BACKGROUND OF THE INVENTION

This invention relates to display systems for analog values, and particularly to bar graph analog displays of a value which may vary and must be continuously monitored.

In industrial processes it is frequently necessary continuously to measure and monitor conditions such as temperature, pressure, flow, etc. which are critical to the process. Frequently, transducers convert the parameter to be measured to an electrical value which is then displayed by a D'Arsonval meter movement. Ideally, in a D'Arsonval meter movement the displacement of a pointer is proportional to the magnitude of an input current. This current is a known function of the input parameter to be measured so that the pointer displacement is a measure of the input parameter. Thus, the information is displayed in the form of a displacement which is continuously analogous to the input parameter.

Another electronic device which generates a displacement analog of an electrical value transduced from a parameter to be measured is a servo indicator. Here a motor drives an indicator and an electrical equivalent of the motor position is compared with the input value. When the motor reaches a null balance the indicator displays a value corresponding to the parameter to be measured.

Process parameters may also be displayed digitally. A multi-digit number is displayed which indicates the value of the input parameter.

All of these displays have certain disadvantages. Both the D'Arsonval movement and the servo system involve the use of moving parts which are susceptible to destruction or failure as a result of shocks. Servo indicators are subject to hysteresis errors. An all-electronic digital indicator is rugged and has no moving parts. However, it requires mental calculation on the part of the observer to determine how far the value has strayed from an ideal value or from between desired limits.

Analog displays yield more information about a parameter than just its magnitude. By observing the pointer or scale it can be noted that the variable is steady or drifing up and down and that it is, or is not, near some particular reference point. This type of information is generally called "rate information" or "trend information." Trend information is particularly useful when many instruments are grouped together, all of which are monitoring different parameters of a process. By viewing the magnitudes and trends of all measurements, a clearer picture of the process can be reached than by observing single measurements only. Furthermore, in many cases, it is desirable to know if a measured parameter is close to a danger point. By providing an index mark, it is possible to spot an approaching problem quickly using trend information.

Recently a new type of display device has been developed and marketed under the trademark Self-Scan. Basically this is composed of a multi-element gas discharge device in which the area of illumination is moved around a display by selective excitation of the elements. A large number of cathode elements are printed on an insulating substrate. A transparent cover for this pattern carries a transparent anode surface on its underside. The interior between the cover and the pattern is filled with an ionizable gas. A glow discharge is generated between the anode plate and the cathode elements. A keep-alive anode forms a continuous discharge with a keep-alive cathode. The gap between them provides a continuous source of metastable ions. The system is energized so that the glow at any electrode can transfer only between adjacent gaps. A reset cathode near the keep-alive gap transfers the glow to a reset gap formed between the reset cathode and the transparent anode. The remaining cathodes are connected in three groups so that the glow can be constrained to travel along the display by opening the cathode which has the glow and grounding the next cathode in the desired phase sequence. The length of the illuminated area represents a quantized indication of an input parameter having trend information. Such devices have a number of disadvantages. They merely display a process parameter without displaying the range within which this process parameter may vary. While the variable range may be painted behind the bar, it is desirable that the limits of this range be made variable so that they can be reset.

An object of the invention is to improve systems of this type.

Another object is to improve the display device itself so that it is capable of furnishing variable range limit information.

SUMMARY OF THE INVENTION

According to a feature of the invention, these objects are attained in whole or in part, by forming a row of ionizable electrodes in an enclosure having an ionizable gas and spacing an electrode arrangement within the enclosure close enough to the electrodes to permit a visible discharge of a given intensity when a predetermined discharge voltage is applied between an electrode and the arrangement, and then, within each of a multiplicity of cycles, generating a first potential between the electrode arrangement and sequential ones of the electrodes over a given distance corresponding to a first settable value, and a second potential between the arrangement and other sequential ones of the electrodes over a distance corresponding to the difference between the first value and the second value, and the first potential between the electrode arrangement and the remaining ones of the electrodes in sequence.

This produces three visibly distinct areas along the electrodes. According to one embodiment two of these areas form aligned illuminated bands with a less illuminated band between them. The transition between the illuminated portions and the unilluminated portions represent set points.

According to another feature of the invention, a second set of electrodes is aligned within the enclosure and a second electrode arrangement operates with the electrodes as the electrodes are scanned to produce an illuminated band whose length corresponds to an input voltage. The band corresponding to the input voltage is then located side by side with the band indicating the set points. This enables an observer to determine whether the input value lies between predetermined set points.

According to another feature of the invention, one of the plurality of electrodes forms a bar shaped display and reset electrodes are provided at the end of each bar so that successive scanning can start from either end of the bar.

According to another feature of the invention the circuit means energize the electrode arrangement and scan the electrodes from one reset electrode at one end of the bar until a band whose length corresponds to one set point value is illuminated, and then ceases scanning until the remaining portion of the scan cycle would produce an illuminated band from the second set point value to the upper limit. At this time the electrodes are scanned from the reset electrode opposite the first reset electrode.

These and other features of the invention are pointed out in the claims. Other objects and advantages of the invention will become evident from the following detailed description when read in light of the accompanying drawings.

DESCRIPTION OF PREFERRED EMBODIMENTS

Figure 1:
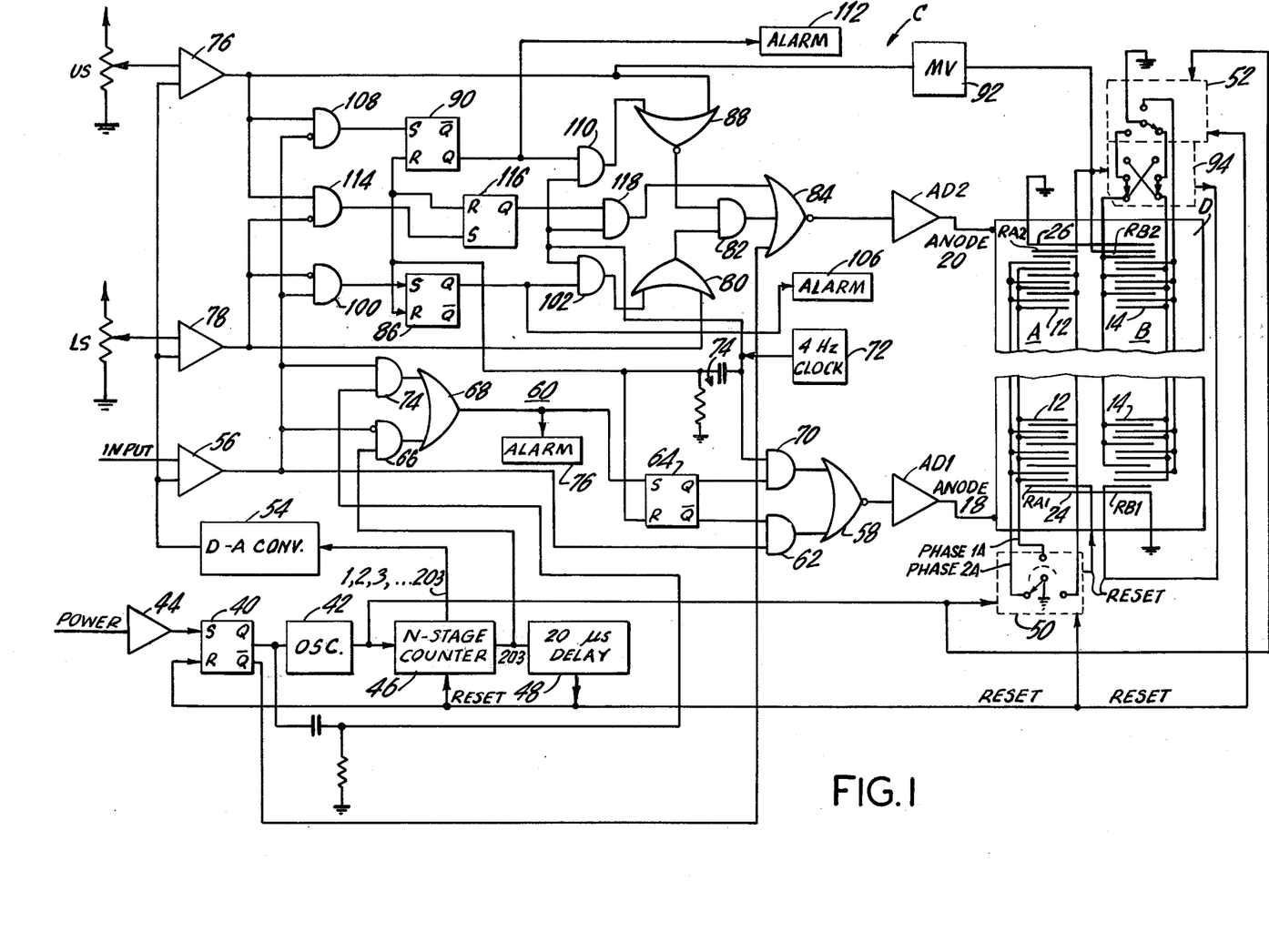
FIG. 1 is a schematic and logic diagram of a system embodying features of the invention.

In FIG. 1 a driver circuit C operates a bar graph display D. The bar graph display D is shown only partially in FIG. 1. Details of the display D appear in FIG. 2.

Figures 2, 3:
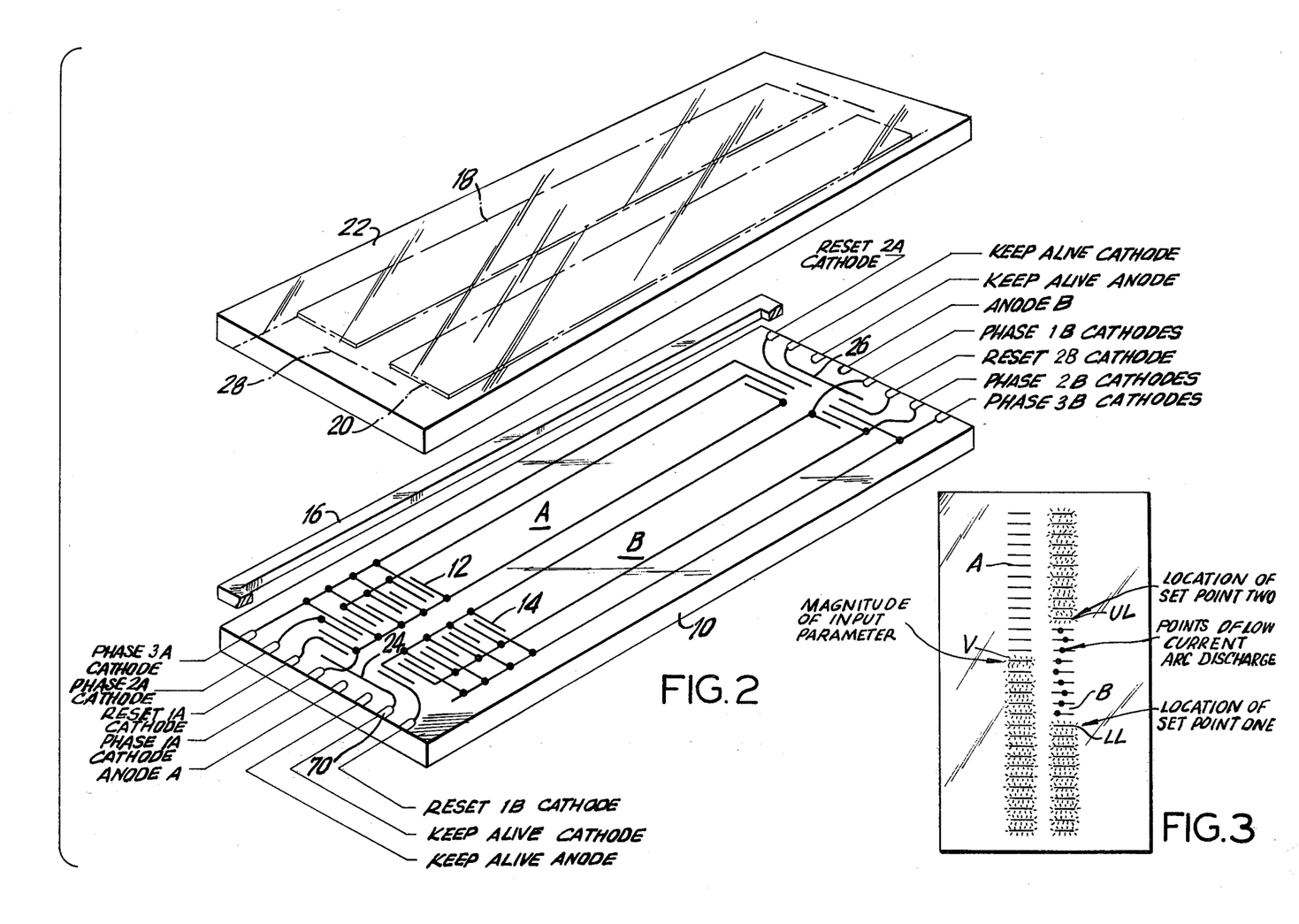
FIG. 2 is an isometric drawing of a display unit used in FIG. 1 and embodying features of the invention.
FIG. 3 is a schematic representation of the unit in FIG. 3 illustrating the manner in which the unit may be illuminated.

In FIGS. 1 and 2, the upper surface of a substrate 10 supports two rows of 203 aligned printed wiring cathodes 12 and 14 which form two graph bars A and B of the display D. Every third cathode 12 is interconnected by three conductors to form phase 1A cathodes, phase 2A cathodes, and phase 3A cathodes as shown. Similarly, three separate conductors connect respective third ones of the cathodes 14 to form phase 1B cathodes, phase 2B cathodes, and phase 3B cathodes.

An insulating spacer 16 in the shape of a frame rests on the top peripheral edge of the substrate 10. The spacer separates the cathodes 12 and 14 from two transparent anodes 18 and 20 printed over the areas shown on the bottom face of a transparent cover plate 22. The anode 18 overlies the cathodes 12 and the anode 20 overlies the cathodes 14. The substrate 10, spacer 16 and plate 22 are sealed to form a gas-tight unit which contains an ionizable gas such as neon.

Two reset cathodes RA1 and RA2 are printed on the substrate 10 at the extreme ends of the cathodes 12 and connected to the substrate edge. Reset cathodes RB1 and RB2 are printed on the substrate 10 at the ends of the cathodes 14 and connected to opposite end edges of the substrate. The anodes 18 and 20 are sufficiently long to overlie the reset cathodes.

Extending between the reset cathodes RA1 and the reset cathode RB1 but spaced therefrom by one inter-cathode step is a keep-alive cathode 24 printed on the substrate 10 and connected to a terminal. Extending from the reset cathode RA2 to the reset cathode RB2 is a second keep-alive cathode 26 also spaced from each of the reset cathodes by one intercathode step. Above the keep-alive cathodes 24 and 26 on the under surface of the plate 22 are keep-alive anodes 28 and 30 connected to otherwise unidentified terminals.

To drive the bar graph display D, the driver circuit C establishes a 250 volt potential between the keep alive cathode 24 and the keep alive anode 28 as well as between the keep alive cathode 26 and the keep alive anode 30 sufficient to ionize the gases between the elements 24 and 28 and between the elements 26 and 30 and to maintain the gas in its ionized state.

The keep alive gaps between the keep alive anodes and cathodes provides a continuous source of metastable ions in response to the power supplied. This provides the starting point for the entire operation.

In order to illuminate the portion of the bar A corresponding to an analog value, circuit C grounds the reset cathode RA1 and a positive potential is applied to the anode 18. This potential together with the internal geometry of the display and the gas mixture, is selected so that the glow at any electrode can transfer between, but only between, adjacent anode-to-cathode gaps. The glow in the keep alive gap at the cathode 24 now transfers to the anode-cathode reset gap. The driver circuit C then grounds the phase 1A cathodes and ungrounds or opens the reset cathode RA1. The glow now transfers from the reset cathodes RA1 to the nearest phase 1A cathode. The circuit C then grounds the phase 2A cathodes and transfers the glow to the nearest phase 2A cathodes. Similarly, the driver circuit C then grounds the phase A3 cathodes and opens the phase A2 cathodes to transfer the glow to the nearest phase A3 cathode. By continuously grounding the phase 1, phase 2, and phase 3 cathodes in sequence and ungrounding the other cathodes the driver C constrains the glow to travel along the display. Effectively the driver circuit C opens the cathode which has the glow and grounds the next cathode in the desired phase sequence. The travel of the glow along the bar A continues until a point is reached that corresponds to the analog of the value to be displayed. The anode 18 is then de-energized and the continuing scan along the cathodes fail to produce a glow.

After the circuit C has grounded the cathodes 12 a total number of 203 times so that the scan reaches the top, the driver circuit C waits to be recycled at which time it again grounds the reset cathode RA1 and repeats the sequence. The basic parameters of the system establish the length of an entire display time within each cycle to be between ten and twenty-five milliseconds. In a preferred embodiment the cycles are synchronized with a power line of 50 or 60 Hz. The cycles and the scanning speed, i.e., the inter-gap glow transfers are sufficiently rapid and frequent so that a portion of the bar A corresponding to the analog value of the input voltage appears to be continuously illuminated. That is, the persistance of an observer's eye sees an illuminated bar portion extending from the reset cathode through the furthest cathode at which a glow has been introduced by grounding of the cathode and operation of the anode 18. This is shown in FIG. 3.

The system of FIG. 1 also displays a visual range within which the input value shown in bar A is supposed to vary. The driver circuit C does this by illuminating the bottom portion of the bar B from the reset cathode RB1 to a lower set point established by a lower set point control LS and by illuminating the top of the bar B from the reset cathode RB2 down to an upper set point established by an upper set point control US in the driver circuit C. The unilluminated portion in the bar B represents the range. As shown in FIG. 3, the bar A is illuminated to a value V and the bar B between the bottom and a lower location LL and between the top and an upper location UL. If the system is to monitor a process variable that is permitted to vary between the ranges established between the upper set point and lower set point shown as UL and LL, an observer can note that the value V is between the set point. If the value V falls below the value LL or rises above the value UL, the observer is informed that the variable to be monitored has increased or decreased beyond the permitted range. In order to inform an observer more readily that the input value has increased or decreased beyond the permitted range either the upper or the lower illuminated portion of the bar B is flashed when the input value causes the illuminated portion of the bar A to fall outside the permissible range.

In the driver circuit C a flip-flop 40 synchronizes an oscillator 42 to a power line through a buffer amplifier 44. The resulting synchronization prevents stroboscopic interaction between ambient lighting and the display. When a positive zero crossing of the power line voltage occurs, buffer amplifier 44 enables the flip-flop 40 which in turn starts the oscillator 42. The latter produces clock pulses which drive an N stage counter 46. When the counter reaches the number 203 it triggers a 20 microsecond delay generator 48 which creates a reset pulse. At the end of this measurement cycle, the reset pulse disables flip-flop 40 which turns off the oscillator 42 until the next positive zero crossing of the power line at the buffer amplifier 44. The oscillator frequency is chosen to ensure that a measurement cycle is shorter than the interval between the power line voltage positive zero crossings. In this case the measurement cycle is less than 16 ms whereas the positive zero crossings occur every 16⅔ ms for 60 Hz or 20 ms for 50 Hz. The number 203 equals the number of electrodes 12 and also the number of electrodes 14 in the respective bars A and B. One of these cathodes represents zero on the scale. Therefore, to indicate an overscale condition, there are 203 states in the counter 46 N must equal at least 203. Since the length of the measurement cycle is N pulses, the oscillator 42 produces N pulses in somewhat less time than one cycle of the power line. Therefore, the oscillator 42 operates at a frequency greater than N times the power line frequency.

The oscillator 42 drives two 3-phase cathode drivers 50 and 52, and an N-stage counter 46. The drivers 50 and 52 are illustrated as rotating selector switches which step one position for each pulse applied by the oscillator 42. In the successive positions of the driver 50 it successively and repeatedly grounds the phase 1A, phase 2A, and phase 3A cathodes. When the reset cathode has been grounded and the glow transferred from the keep-alive cathode, this repeatedly transfers the ionization glow from between the reset gap through the successive gaps along the bar A. While the driver 50 is shown as a rotating selector switch it may be representative of any type of logic arrangement capable of performing this function. In a preferred embodiment suitable buffer amplifiers exist between the driver 50 and the cathodes 12. The driver 52 performs the same function with the cathodes 14. However, intervening between the driver 52 and the cathodes, or any buffer amplifiers which may be used, is a phase reversing circuit shown as a double pole, double throw switch, which may represent any suitable logic circuit that performs this function. The driver 50 advances the input display while the driver 52 advances the set point display.

The N stage counter 46 drives an N level digital-to-analog converter 54. The latter provides an output voltage proportional to the number in the counter. Thus, as the count increases from zero on each clock pulse from the N stage counter, the converter exhibits a voltage which increases linearly with the clock pulses or time, one level of increase for each clock pulse. Hence, each clock pulse advances the display one bar element and increases the converter output one unit of voltage.

The output of the digital-to-analog converter 54 is applied to a comparator 56 which compares this voltage to the input voltage. The input voltage is a preconditioned version of a parameter to be measured. A transducer, compressor, expander or other device conditions the input signal for operation in this environment. As long as the input voltage exceeds the converter 54 voltage, the comparator 56 produces a logic zero signal. During this time a NOR gate 58 produces a logic 1 that permits an anode driver AD1 to apply the required glow-producing anode voltage at the anode 18. As long as this occurs, the anode 18 remains positive and the driver 50 advances the display of the discharge glow from cathode to cathode along the bar A. The NOR gate 58 forms part of an over and under range flashing circuit 60 through which the output of the comparator 56 passes.

When the output of converter 54 equals or exceeds the input voltage, the comparator 56 produces a logic 1 signal. An AND gate 62 combines this signal with a logic 1 signal from the $\bar{Q}$ terminal of a normally reset S-R flip-flop 64 to produce a logic 1 signal. The NOR gate 58 then produces a logic zero signal that causes the anode driver AD1 to ground the anode 18. The display of glow discharge along the bar A ceases advancing. The portion of the bar A along which the glow advanced is proportional to the input signal. The clock pulse 42 continues ineffectively to drive the driver 50 until the counter 46 advances to the number 203. After a 20 microsecond delay produced by the delay 48, the flip-flop 40 is reset and the oscillator 42 stops generating clock pulses.

Upon the next zero crossing of the voltage in the power line, the amplifier 44 again sets the flip-flop 40 and the process is repeated at the rate of the power line frequency. The continued glow advance over the section of the bar proportional to the value of the input produces what appears to be a persistent bar shaped glow along the bar A corresponding to the value of the input.

An over-range and under-range comparison is made by examining the state of the comparator 56 at reset time and at full scale. In this regard, it should be noted that the comparator 56 effectively operates as a pulse width modulator.

At the count of 203 the counter 46 enables an AND gate 66. If the converter 54 voltage has not yet reached the input voltage at the count of 203, it indicates that the input voltage lies beyond the operating voltage of the system. The comparator 56 then still produces an outut of a logic zero value. An inhibitor terminal, i.e. a logic reversing terminal at the AND gate 66 then applies a logic 1 to the AND gate which produces a logic 1. An OR gate 68 then sets the flip-flop 64. This applies an enabling signal to an AND gate 70 and disables AND gate 62. This allows a 4 Hz clock to cause the NOR gate 58 and anode drive AD1 alternatively to ground and energize the anode 18 four times per second. In view of the fact that the scanning occurs at the rate of 60 per second, the resulting effect is to produce a fully illuminated bar flashing four times per second. A differentiating circuit 74 keeps resetting the flip-flop 64 after each 4 Hz clock pulse from clock 72.

It is possible that the input voltage is less than the lowest reading of the scale established for the bar A and the display D. When this occurs, the output potential of the converter 54 already exceeds the input voltage at the beginning of the measurement cycle from the flip-flop 40. The comparator 56 then produces a logic 1 at an AND gate 74 which is enabled by the short cycle start pulse. During the enabling of the start pulse, the output of AND gate 74 sets the flip-flop 64. This enables the AND gate 70 and causes the anode driver AD1 alternately to energize and inhibit the anode 18 four times per second. This continues as long as the input voltage is less than the lowest converter 54 voltage because the cycle start pulse at the AND gate 74 is occurring at the rate of the power line frequency. This flashing warns an observer. A separate alarm 76 also indicates the presence of the over-range or under-range condition.

Flashing is not caused in normal operation because the cycle start pulse occurs at the AND gate 74 only once per cycle and normally the input voltage exceeds the converter 54 voltage so as to produce no input coincidence at the AND gate 74 and thus no output voltage at this gate. Similarly, the output pulse 203 from the counter 46 enables the AND gate 66 only momentarily. Thus during in range operation coincidence does not occur at the AND gate 66.

As seen from above, when either an under-range or over-range condition exists, a 125 millisecond full scale display alternates with a 125 millisecond no display. This warns the operator that an out-of-range condition exists. Both conditions full flash the scale. It is left to the observer to determine by other means which out-of-range condition exists. In the present embodiment, the set points will determine which out-of-range condition exists. If the input is over-range, the high set point will trigger and flash the high set point portion of the display. The converse is true for an under-range condition.

The bar B displays high and low set points between which the indication in the bar A is supposed to lie for proper operation. To generate the set points two potentiometers US and LS generate upper and lower set point command voltages. Comparators 76 and 78 compare these set point voltages with the output of the converter 54. From the start of each counting cycle after reset, the comparator 78 produces a logic zero until the lower set point is reached. Similarly the comparator 76 produces a logic zero until the higher set point is reached. A OR gate 80 passes the logic zero value through an AND gate 82 and a NOR gate 84. An anode driver AD2 energizes the anode 20. This occurs as the driver 52 scans the bar B from bottom to top by advancing the glow from the reset cathode RB1 along the phase 1B cathodes, phase 2B cathodes, and phase 3B cathodes (14). When the lowest set point is reached, the comparator 78, which operates as a pulse width modulator, produces a logic 1 output. In the meantime the comparator 76 is still producing a logic zero output. The logic 1 from the comparator 78 passes through OR gate 80 and the AND gate 82. The logic 1 at the input of the NOR gate 84 constrains the anode drive AD2 to inhibit the anode 20 voltage so that glow advance along the bar B stops. During this time the logic zero output from the comparator 76 has disabled a NOR gate 88 which has enabled the AND gate 82. When the converter 54 potential reaches the upper set point at the potentiometer US, the comparator 76 produces a logic 1. The NOR gate 88 produces a logic zero that turns off gate 82 and prevents the NOR gate 84 from further inhibiting the anode driver 82. Thus the anode 20 is energized. At the same time, a monostable multivibrator 92 produces a pulse that reverses the polarity on a switch 94 shown as a double pole, double throw switch but capable of being embodied as a logic circuit. This reverses the phase of the driver circuit 52. At the same time the pulse from the monostable 92 actuates the reset cathode RB2 so that the various phases of cathodes 14 are scanned downwardly. As long as the anode 20 is energized, illumination of the ionizable gas between the gaps from the cathodes 14 to the anode 20 continues in sequence. When the N stage counter reaches the count 203 flip-flop 40 is reset which produces an anode inhibiting voltage at NOR gate 84 until the next zero crossing from the power line.

Because the bar B was illuminated by scanning from the top only from the time the converter 54 voltage reached the upper set voltage to the end of the count 203, only the portion of the bar from the top to the upper set voltage is illuminated beyond the earlier illumination of the portion below the lower set voltage.

Thus, when the lower set point is reached, signals from the comparator 78 hold the set point display cathodes in the reset mode without the anode energized. When the upper set point is reached, another signal from the comparator 76 reverses the counting sequence of the cathode drivers. At this time, the upper reset cathode is grounded, the anode energized and the driver 52 reversed. A discharge has now been formed at the top of the set point display bar B and counts down until full scale is reached and the measurement cycle ended. Therefore, the length of the bar illuminated to represent the upper set point is actually equal to the difference between the full scale and the upper set point.

Aside from establishing a display of the high and low limits at the bar B relative to the input at the bar A, the driving circuit C produces flashing and alarm signals when the input voltage falls below the low set point voltage or exceeds the high set voltage. Normally, within any one cycle, if the input value lies between the lower set point and upper set point, the output of comparator 56 shifts from logic zero to logic 1 after the output of comparator 78 shifts from logic zero to logic 1 but before the output of comparator 76 shifts from logic zero to logic 1. An inhibited AND gate 100 responds to the inverted output of comparator 78 and the output of comparator 56. The AND gate 100 flips the flip-flop 86 and enables an AND gate 102. This gate allows the 4 Hz oscillator 72 to over-ride the zero signals in the OR gate 80. The logic 1 from AND gate 102 causes NOR gate 84 to turn off the voltage at anode 20. Thus, the lower segment of the bar flashes at a 4 Hz rate, i.e., blank for 125 ms. and normal length for 125 ms. A pulse from oscillator 72 also resets the flip-flop 86 in synchronism with the flashing circuit. An audible alarm 106 is also operated by the flip-flop 86. The audible alarm may be set for a predetermined time with a monostable multivibrator internal to the alarm. The alarm output can also be a control relay, SCR signal or other control device. According to an embodiment of the invention, the alarm output is in the form of control relays, SCR controllers or other control device which alters the operation being tested or monitored.

An AND gate 108 produces a logic 1 only when the input comparator 56 has not yet shifted to a logic 1 after the upper set point comparator 76 has already done so. This is indicative of a high out-of-range condition of the input voltage. It operates a flip-flop 90 which enables an AND gate 110. The latter permits the oscillator 72 to cause the NOR gate 84 to de-energize the anode 20 four times per second. This causes flashing of the bar B during scanning of the cathodes 14. The oscillator 72 resets the flip-flop 90 at a 4 Hz rate and the AND gate 110 is disabled in synchronism with the oscillator 104.

An alarm 112 produces an audible or other indication or output for a predetermined period in response to the flip-flop 90. The alarm 112 may utilize an internal monostable multivibrator to maintain the alarm for a predetermined period. However, in the circuit shown the flip-flops in the alarm 106 and 112 operate for a period of approximately ¼ second. As soon as the out-of-limit condition disappears, the flip-flops 90 or 86 are reset and flashing stops with in 250 milliseconds.

It is possible that the lower set point may accidentally be set above the upper set point. An AND gate 114 senses this condition. Thus if the output of comparator 78 is zero while that of comparator 76 is 1, the AND gate 114 produces a logic 1. This sets a flip-flop 116 which is reset by the oscillator 72 at a 4 Hz rate and enables an AND gate 118 at the 4 Hz rate so as to permit the oscillator 104 periodically to flash the bar B. This is done through the NOR gate 84 and the anode driver AD2.

A suitable alarm may also be connected to the Q terminal of the flip-flop 116.

According to another embodiment of the invention it is possible to eliminate the need for the reset cathodes RA2 and RB2. This can be accomplished with the system disclosed in FIG. 4. Here a clock 120 synchronized with the power line avoids flicker interference with ambient lighting. The clock drives a counter 122 which resets all the logic on the 201st pulse. The clock also drives a three phase cathode driver circuit 124. The latter advances the discharge point of the display by sequential switching of the cathode groups. It also drives a ramp generator 126 which generates a linear voltage ramp. The input signal is conditioned by a conditioning circuit 128 to a voltage level suitable to be compared with the output of ramp generator 126. When the ramp voltage equals the input voltage a comparator 130 turns on an anode shunt transistor 132. The latter shuts off the arc discharge and terminates the advance of the left hand bar. The band illuminated has a length proportional to the input.

Figure 4:
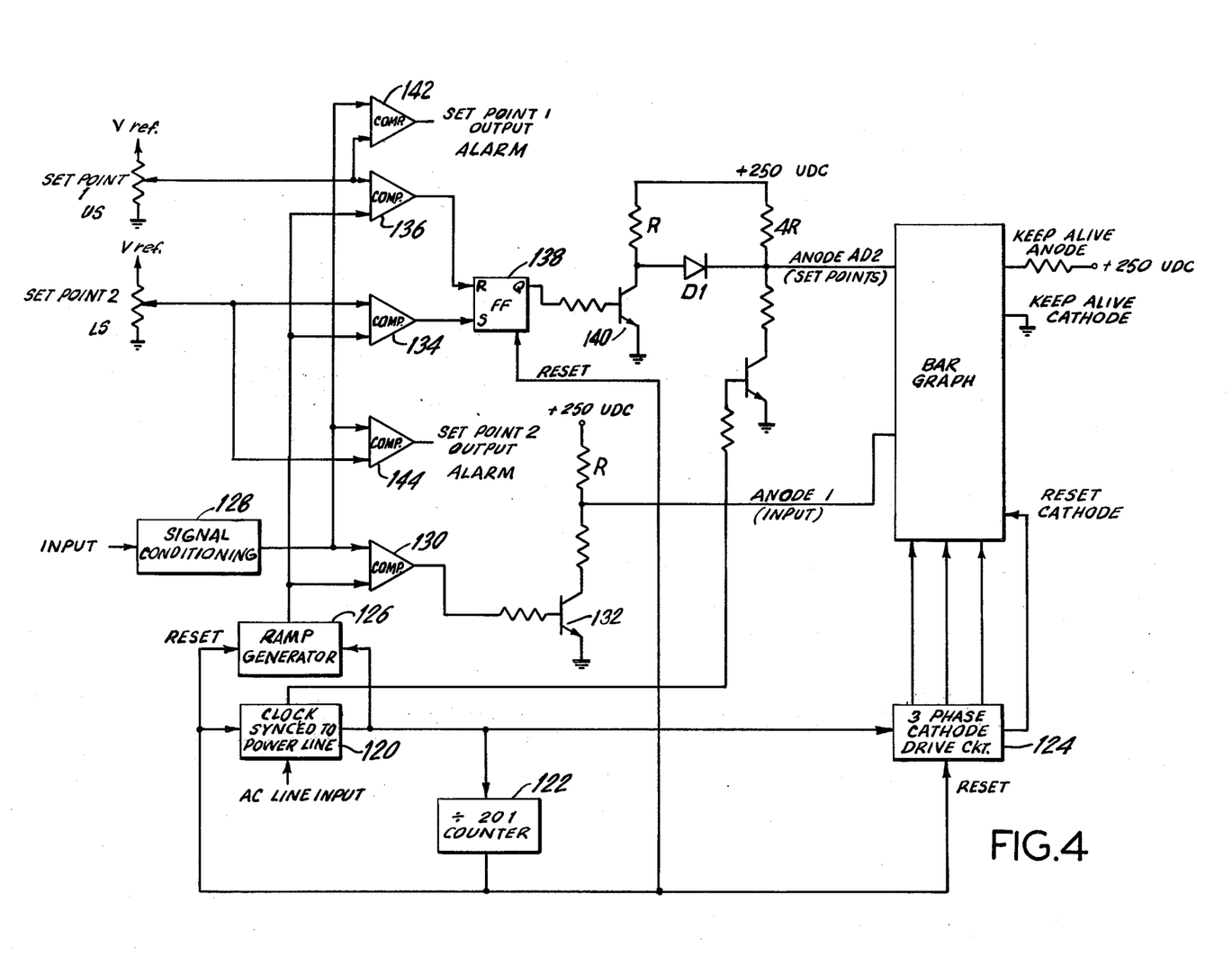
FIG. 4 is a circuit diagram illustrating another system embodying features of the invention.

Two set point potentiometers LS and US generate set point command voltages which are compared with the ramp generator 126 output signal in two comparators 134 and 136. The output of the comparator 134 defines the point or time that the ramp voltage is equal to the lower set point. At this time flip-flop 138 is set and its output Q goes positive, turning on transistor 140. Therefore, the current in anode AD2 which has been flowing through a resistor R, a diode D1 and a resistor 4R flows through 4R only. Thus the current decreases to one-fifth of its former value and the bar dims dramatically. When the ramp voltage reaches the upper set point command voltage the comparator 136 switches, resetting flip-flop 138. At this time the transistor 140 turns off. The current in anode AD2 increases, and the display brightens at the location of the upper set point. The display remains bright until the 201st set pulse when it goes out until the measurement sequence repeats at the next zero crossing of the power line.

Comparators 142 and 144 compare the set point value to the conditioned input signal. These comparators produce an alarm when the input voltage is outside the range between the lower set point and upper set point voltages.

Figure 5:
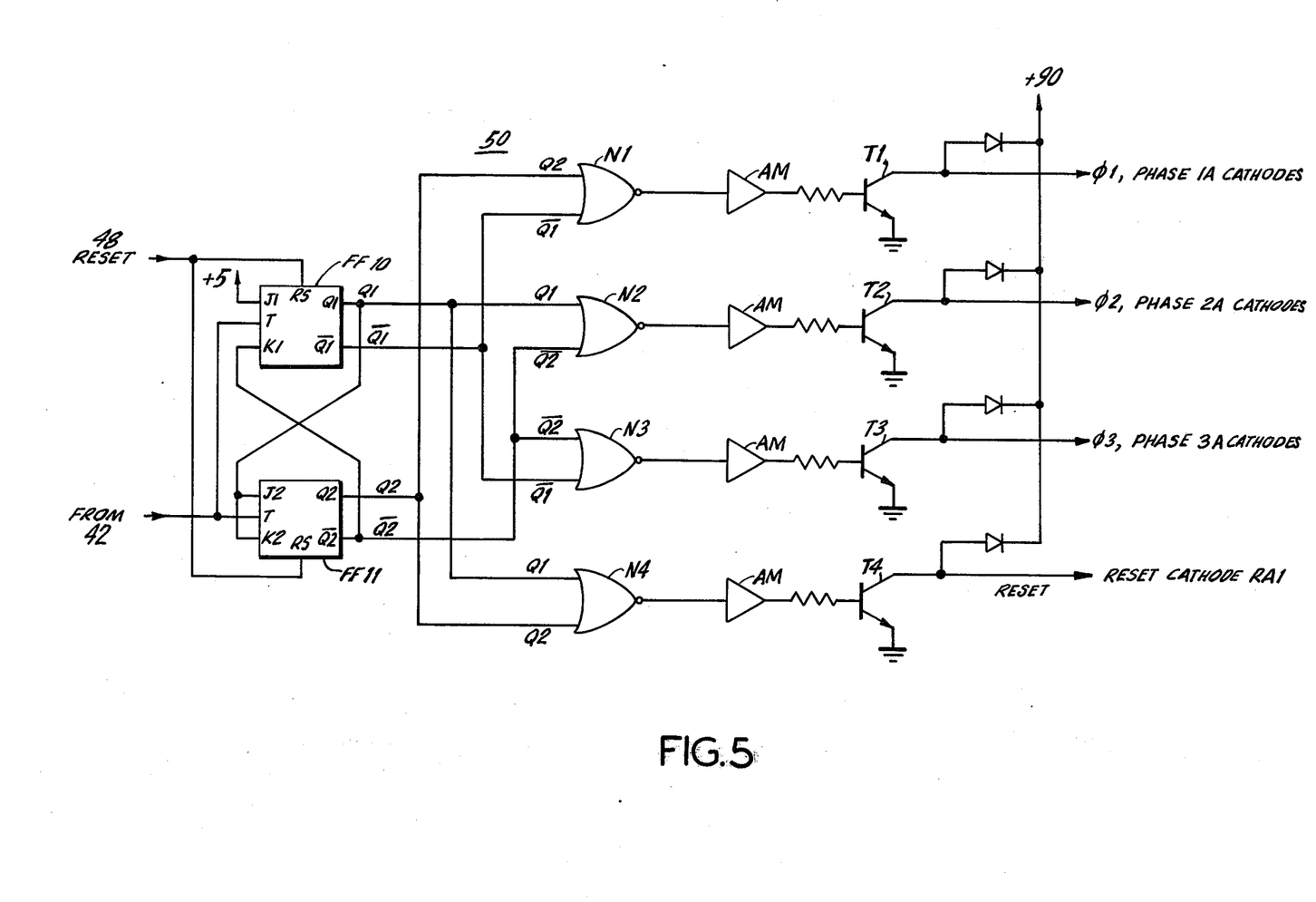
FIGS. 5 and 6 are logic diagrams illustrating embodiments of of drivers utilized in FIG. 1 and FIG. 4.

FIG. 5 illustrates a logic diagram of the driver 50 in FIG. 1. A reset signal from the delay 48 causes the driver 50 to ground the reset cathode RA1 and to prepare the armature of the selector switch to contact with terminal connected to the phase 1A cathodes. Thereafter once the oscillator 42 begins to produce successive clock pulses at the beginning of the next cycle, each clock pulse steps the armature to the successive set of cathodes. The driver 50 of FIG. 5 is composed of two interconnected JK flip-flops FF10 and FF11 which respond to the inputs in accordance with the following truth table.

TABLE 1

| Input | | JK states from Previous output | | | | Output | | | | JK states resulting from output | | | |
| --- | --- | --- | --- | --- | --- | --- | --- | --- | --- | --- | --- | --- | --- |
| R | T | J1 | K1 | J2 | K2 | Q1 | Q̄1 | Q2 | Q̄2 | J1 | K1 | J2 | K2 |
| 1 | 0 | | | | | 0 | 1 | 0 | 1 | 1 | 1 | 0 | 0 |
| 0 | 1 | 1 | 1 | 0 | 0 | 1 | 0 | 0 | 1 | 1 | 1 | 1 | 1 |
| 0 | 2 | 1 | 1 | 1 | 1 | 0 | 1 | 1 | 0 | 1 | 0 | 0 | 0 |
| 0 | 3 | 1 | 0 | 0 | 0 | 1 | 0 | 1 | 0 | 1 | 0 | 1 | 1 |
| 0 | 4 | 1 | 0 | 1 | 1 | 1 | 0 | 0 | 1 | 1 | 1 | 1 | 1 |
| 0 | 5 | 1 | 1 | 1 | 1 | 0 | 1 | 1 | 0 | 1 | 0 | 0 | 0 |
| 0 | 6 | 1 | 0 | 0 | 0 | 1 | 0 | 1 | 0 | 1 | 0 | 1 | 1 |
| etc | | | | | | | | | | | | | |

As shown in the truth table, only a reset pulse produces an output Q1=Q2=0. Successive clock pulses thereafter produce three repeating sequences of other outputs.

NOR gates N1, N2, N3, and N4 in FIG. 5 respond to the outputs of the flip-flops FF10 and FF11 in accordance with the following truth table.

TABLE 2

| R | T | Q1 | Q̄1 | Q2 | Q̄2 | N1 | N2 | N3 | N4 |
| --- | --- | --- | --- | --- | --- | --- | --- | --- | --- |
| 1 | 0 | 0 | 1 | 0 | 1 | 0 | 0 | 0 | 1 |
| 0 | 1 | 1 | 0 | 0 | 1 | 1 | 0 | 0 | 0 |
| 0 | 2 | 0 | 1 | 1 | 0 | 0 | 1 | 0 | 0 |
| 0 | 3 | 1 | 0 | 1 | 0 | 0 | 0 | 1 | 0 |
| 0 | 4 | 1 | 0 | 0 | 1 | 1 | 0 | 0 | 0 |
| 0 | 5 | 0 | 1 | 1 | 0 | 0 | 1 | 0 | 0 |
| 0 | 6 | 1 | 0 | 1 | 0 | 0 | 0 | | |
| | 0 | | | | | | | | |
| etc | | | | | | | | | |

This truth table also includes, for reference, the inputs RS and T which have produced the outputs in the flip-flop FF10 and FF11. Only a reset pulse produces a 1 at the output of NOR gate N4. Thereafter successive clock pulses produce 1's at the NOR gate in the order N1, N2, N3, N1, N2, N3 . . .

Suitable amplifiers AM and resistors apply the outputs of the NOR gates to the bases of transistors T1, T2, T3, and T4.

Each transistor T1, T2, and T3 ground one of the phase 1A, phase 2A, and phase 3A cathodes when the transistor is turned on by a 1 appearing at the NOR gate connected to its base. The truth table for the NOR gates N1 to N4 illustrate that a reset voltage always results in a 1 at the NOR gate N4 and therefore grounds the reset cathode RA1. Subsequent clock pulses then ground the cathodes in the order phase 1A, phase 2A, phase 3A.

Figure 6:
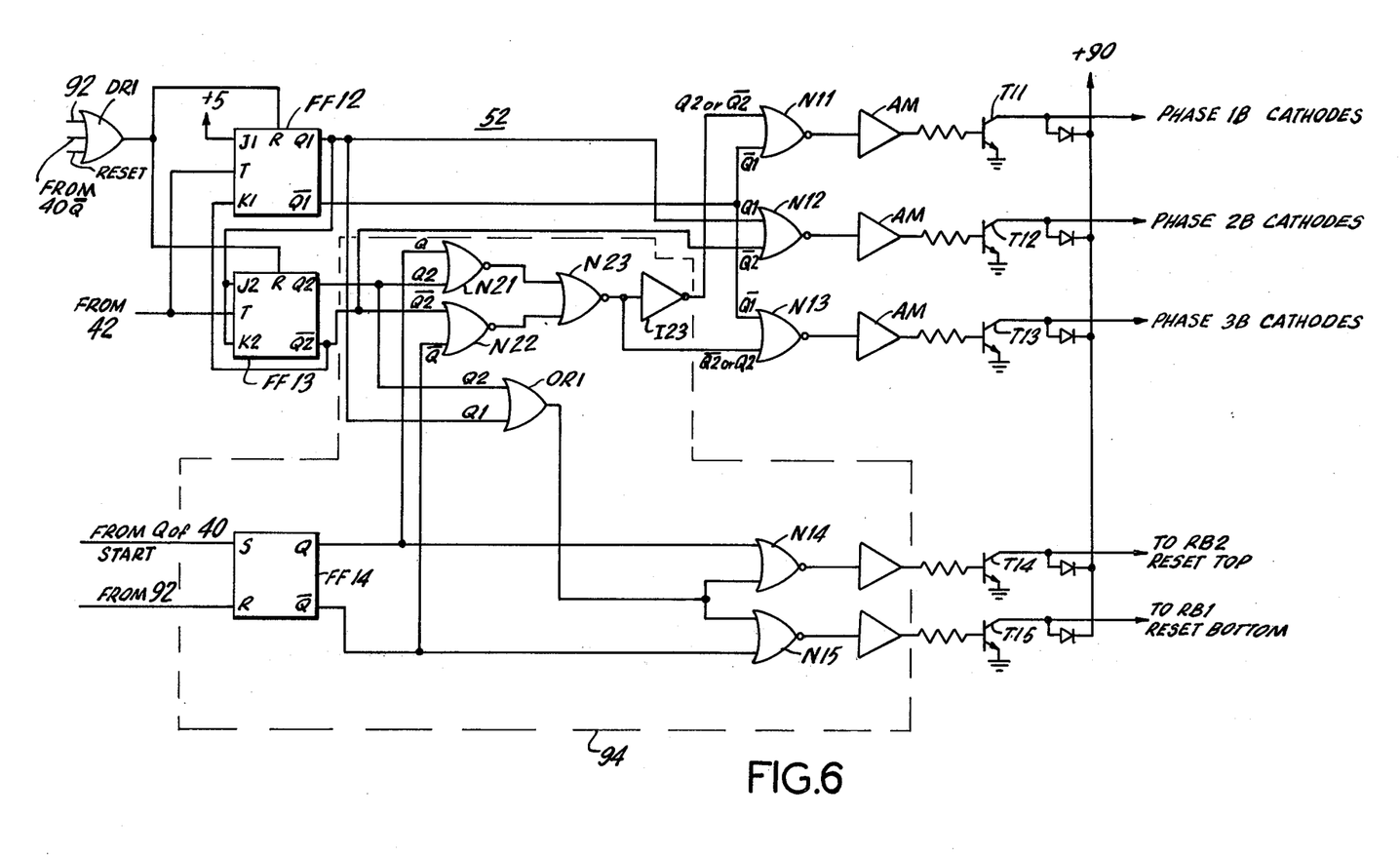

FIG. 6 is a circuit diagram illustrating the driver 52 and reversing arrangement 94 of FIG. 1 in detail. Here, the flip-flop FF12 and FF13 are interconnected in the same manner as the flip-flop FF10 and FF11. The NOR gates N11, N12, N13, correspond to the NOR gates N1, N2, and N3. However, intervening the outputs from the flip-flop FF13 and the NOR gates N11 and N13 is the inverting circuit 94 which reverses the top and bottom inputs of the NOR gates N11 and N13.

In FIG. 6, the flip-flops FF12 and FF13 are reset either by the reset signal from the delay 48 or from the start signal at the terminal $\bar{Q}$ of the flip-flop 40, or from the multivibrator 92. Thus the flip-flops FF12 and FF13 are reset three times during each cycle.

Within the reversing circuit 94 a flip-flop FF14 is set at the start of each cycle by the terminal Q of flip-flop 40 so as to produce sequential ionization from the bottom reset cathode RB1. At a signal from the multivibrator 92. The flip-flop FF14 causes energization of the reset cathode RB2 at the top of column 14 and reverses the order of cathode grounding.

The following two tables define the operation of the reversing circuit 94. Table No. 5 defines the resulting three-phase cathode control with phase reversal.

NOR gate 13. The application of a signal from the mutivibrator 92 reverses this application.

Table No. 4 illustrates that the existence of a reset pulse as determined by simultaneous zeros at the terminal Q1 and Q2 produces a 1 either at NOR gates N14 or N15. This grounds one of the reset cathodes RB1 or RB2. The reset cathodes are not grounded when the terminals Q1 or Q2 have any other condition. When the start signal appears at the flip-flop 40, the NOR gate N15 turns on the transistor T15 and resets the bottom reset cathode RB1. A signal from multivibrator 92 during the reset signals at OR gate OR1 produces a signal at the output of NOR gate 14 which turns on transistor T14 and applies the reset signal to the top reset cathode RB2.

While specific embodiments of the invention have been shown and described in detail to illustrate the application of the inventive principles, it will be understood that the invention may be embodied otherwise without departing from such principles.

We claim:

1. An indicator for exhibiting the analog representation of a test value and two settable limit values representing desired limits of the test value comprising:

TABLE 3

| | | | | | | 3 phase reversing logic | | | | | |
|---|---|---|---|---|---|---|---|---|---|---|---|
| 40 | 92 | Q | $\bar{Q}$ | Q2 | $\bar{Q}2$ | N21 | N22 | N23 | I23 | | |
| 1 | 0 | 1 | 0 | 0 | 1 | 0 | 0 | 1 | 0 | forward | reset and ø1 only |
| 0 | 1 | 0 | 1 | 0 | 1 | 1 | 0 | 0 | 1 | reverse | |
| 0 | 0 | 1 | 0 | 1 | 0 | 0 | 1 | 0 | 1 | forward | ø2 and ø3 only |
| 0 | 0 | 0 | 1 | 1 | 0 | 0 | 0 | 1 | 0 | reverse | |

TABLE 4

| | | | | | Reset reversing logic | | | | |
|---|---|---|---|---|---|---|---|---|---|
| 40 | 92 | Q | $\bar{Q}$ | Q1 + Q2 | OR1 | N14 | N15 | | |
| 1 | 0 | 1 | 0 | 0 | 0 | 0 | 1 | forward | reset time only |
| 0 | 1 | 0 | 1 | 0 | 0 | 1 | 0 | reverse | |
| 0 | 0 | 1 | 0 | 1 | 1 | 0 | 0 | forward | ø 1, 2, or 3, time only |
| 0 | 0 | 0 | 1 | 1 | 1 | 0 | 0 | reverse | |

TABLE 5

| | | Three-phase cathode control with phase reversal | | | | | | | | | | | | |
|---|---|---|---|---|---|---|---|---|---|---|---|---|---|---|
| | | Q1 | $\bar{Q}1$ | Q2 | $\bar{Q}2$ | Q | $\bar{Q}$ | N21 | N22 | N23 | I23 | N11 | N12 | N13 | |
| for-ward | | 0 | 1 | 0 | 1 | 1 | 0 | 0 | 0 | 1 | 0 | 0 | 0 | 0 | reset |
| | | 1 | 0 | 0 | 1 | 1 | 0 | 0 | 0 | 1 | 0 | 1 | 0 | 0 | ø1 |
| | | 0 | 1 | 1 | 0 | 1 | 0 | 0 | 1 | 0 | 1 | 0 | 1 | 0 | ø2 |
| | | 1 | 0 | 1 | 0 | 1 | 0 | 0 | 1 | 0 | 1 | 0 | 0 | 1 | ø3 |
| | | 1 | 0 | 0 | 1 | 1 | 0 | 0 | 0 | 1 | 0 | 1 | 0 | 0 | ø1 |
| reverse | | 0 | 1 | 0 | 1 | 0 | 1 | 1 | 0 | 0 | 1 | 0 | 0 | 0 | reset |
| | | 1 | 0 | 0 | 1 | 0 | 1 | 1 | 0 | 0 | 1 | 0 | 0 | 1 | ø3 |
| | | 0 | 1 | 1 | 0 | 0 | 1 | 0 | 0 | 1 | 0 | 0 | 1 | 0 | ø2 |
| | | 1 | 0 | 1 | 0 | 0 | 1 | 0 | 0 | 1 | 0 | 1 | 0 | 0 | ø1 |
| | | 1 | 0 | 0 | 1 | 0 | 1 | 1 | 0 | 0 | 1 | 0 | 0 | 1 | ø3 |

Table 3 shows that three NOR gates N21, N22, and N23 as well as an inverter I23 reverse the application of the outputs of Q2 and $\bar{Q}2$ at the NOR gates N11 and N13 in response to an input from the terminal Q of flip-flop 40 and the output of multivibrator 92. The start signal from the terminal Q of flip-flop 40 causes the NOR gates N21 to N23 to apply the signal Q2 to the top of NOR gate 11 and the signal $\bar{Q}2$ to the bottom of a display and a circuit coupled to the display;
said display including an envelope containing an ionizable gas, a plurality of aligned electrodes within the envelope and forming a band, an electrode arrangement spaced from the electrodes within the envelope, and an analog device for displaying the test value;
each of said electrodes forming a gap with a portion of the arrangement, each gap forming a discharge path for a visible electric discharge of a given intensity when both the electrode at the gap and the arrangement are simultaneously subject to an enabling condition, an electrode and the arrangement both being subject to an enabling condition by application of respective potentials which produce the discharge voltage, an electrode and the arrangement both being subject to a non-enabling condition by application of potentials which produce a voltage less than the predetermined discharge voltage;

said circuit including electrode operating means coupled to said electrodes for applying an enabling condition to sequential ones of the electrodes in sequence, arrangement operating means coupled to said arrangement for applying the enabling condition to said arrangement;

said circuit including control means responsive to the two settable limit values and coupled to said electrode operating means and said arrangement operating means for repeatedly constraining said operating means to apply one of the conditions to sequential ones of the electrodes and the arrangement simultaneously over two sections of the band so that one section extends over a distance representing one of the values and so the one section is separated from the other section by a distance representing the difference between the two values;

said circuit including energizing means responsive to the test value for constraining said analog device to exhibit an indication of the test value adjacent the band.

2. An apparatus as in claim 1, wherein said electrode operating means includes energizing means for applying the enabling condition sequentially from one end of the band toward the other during the application of the enabling condition over the one section of the band, and reversing means responsive to said arrangement operating means for applying the enabling condition sequentially from the other end of the band during the application of the enabling condition over the other section of the band.

3. An apparatus as in claim 1, wherein said electrode operating means applies enabling signals sequentially from one end of the band to the other.

4. An apparatus as in claim 1, wherein said circuit includes timing means coupled to said control means for generating successive cycles of voltage and for synchronizing the repeated constraining of said control means with the cycles so that each repetition occurs once each cycle.

5. An apparatus as in claim 2, wherein said circuit includes timing means coupled to said control means for generating successive cycles of voltage and for synchronizing the repeated constraining of said control means with the cycles so that each repetition occurs once each cycle.

6. An apparatus as in claim 3, wherein said circuit includes timing means coupled to said control means for generating successive cycles of voltage and for synchronizing the repeated constraining of said control means with the cycles so that each repetition occurs once each cycle.

7. An apparatus as in claim 6, wherein said circuit includes oscillator means oscillating at a rate slower than said timing means, test means responsive to the test value and said limit values for comparing the test value relative to each limit value, and interruptor means coupled to said test means and said oscillator as well as to said one of said operating means for interrupting the application of one of the enabling conditions at a rate slower than the timing means when the test value lies outside of a range between the limits.

8. An apparatus as in claim 7, wherein said interruptor means includes means for interrupting application of the one of the enabling conditions in the second section while maintaining the enabling conditions in the first section when the test value exceeds the higher of the limit values.

9. An apparatus as in claim 7, wherein said interruptor means includes means for interrupting the application of enabling conditions in the first section while maintaining the enabling conditions in the second section when the test value is less than the lower of the limit values.

10. An apparatus as in claim 7, wherein said test means includes remote output means for establishing voltages to produce an indication when the test value lies outside the range between the limits.

11. An apparatus as in claim 10, further comprising an alarm coupled to said remote output means for producing a correction signal and a humanly sensible signal.

12. A display apparatus responsive to two settable values, comprising:

an enclosure having an ionizable gas therein;
a plurality of electrodes aligned in the enclosure;
an electrode arrangement within the enclosure spaced from the aligned electrodes but close enough to permit a visible electric discharge of a given intensity when a predetermined discharge voltage is applied between the electrode and the arrangement;
circuit means responsive to the settable values and coupled to the electrodes and the electrode arrangement for generating a multiplicity of cycles and for generating within each cycle a first potential between the electrode arrangement and sequential ones of the electrodes covering a given distance corresponding to the first settable value, and for generating within each cycle at least one second potential between the arrangement and other sequential ones of the electrodes covering a distance corresponding to the difference between the first value and the second value, and for generating within each cycle the first potential between the electrode arrangement and remaining sequential ones of the electrodes, one of the potentials being equal to the predetermined discharge voltage.

13. An apparatus as in claim 12, wherein:
each of said electrodes and said electrode arrangement forms a gap therebetween so that the discharge can occur in the gap;
said circuit means including scanning means for sequentially applying the potentials so as to cause the discharge to transfer sequentially from one gap to the gap adjacent thereto during the application of one of the potentials.

14. An apparatus as in claim 12, wherein said circuit means includes:
scanning means coupled to said electrodes for establishing the potentials at the electrodes in a sequence at a predetermined rate within each cycle, and
waveform generating means coupled to said scanning means and responsive to said settable values for generating the plurality of successive cycles and a waveform during each cycle which assumes a first electrical level at a first phase within each cycle corresponding to the first of the values and shifts to a second electrical level at a second phase within each cycle corresponding to the second value, and returns to the first level during a third phase within each cycle.

15. An apparatus as in claim 12, wherein said plurality of electrodes and said electrode arrangement form a band having respective ends, and wherein said scanning means includes a scanning control responsive to said waveform generating means for scanning from one end of the band during the first phase and from the other end of the band during the third phase.

16. An apparatus as in claim 15, wherein said second level is insufficient to cause a visible electric discharge.

17. An apparatus as in claim 14, wherein said electrode arrangement and said plurality of electrodes form a band, wherein said scanning means continuously applies the potentials to the electrodes in sequence from one end of the band towards the other until it reaches the other, and wherein said waveform generating means includes means for establishing the first level to produce a visible electric discharge and for establishing the second level thereof to produce an electric discharge less bright than the discharge at the first level.

18. An apparatus as in claim 12, further comprising:
a second plurality of electrodes aligned in the enclosure;
a second electrode arrangement within the enclosure spaced from the aligned electrodes but close enough to permit a visible electric discharge of a given intensity when a predetermined discharge voltage is applied between the electrode and the arrangement;
second circuit means responsive to a variable input value and coupled to the second plurality of electrodes and the second electrode arrangement as well as the first circuit means for generating within each cycle a first potential between the electrode arrangement and sequential ones of the electrodes extending over a given distance corresponding to the input value and at least one second potential between the arrangement and other sequential ones of the electrodes extending over the remaining distance.

19. An apparatus as in claim 18, wherein:
each of said electrodes form a gap with one of the electrode arrangements so that the discharge can occur in the gap;
said first circuit means and said second circuit means each including scanning means for sequentially applying the potential so as to cause the discharge to transfer sequentially from one gap to the gap adjacent thereto during the application of one of the potentials.

20. An apparatus as in claim 18, wherein:
said first circuit means includes first scanning means responsive to said settable values for establishing the potentials at the electrodes in said first enclosure in a sequence at a predetermined rate within each cycle;
said second circuit means including scanning means responsive to the input value for establishing the potentials at the electrodes in the second enclosure in a sequence at a predetermined rate within each cycle;
first waveform generating means coupled to said first scanning means and responsive to the settable values for generating the plurality of successive cycles and a waveform during each cycle which assumes a first electrical level at a first phase within each cycle corresponding to the first of the values and shifts to a second electrical level at a second phase within each cycle corresponding to the second value and returns to the first level during a third phase within each cycle; and
second waveform generating means coupled to said scanning means and said first waveform generating means and responsive to the input value for generating a waveform during each cycle which assumes a first electrical level at a first phase within each cycle corresponding to the input value and shifts to a second electrical level for the remainder of the cycle.

21. An apparatus as in claim 20, wherein first of said plurality of electrodes and said electrode arrangement forms a band having respective ends, and wherein said first scanning means includes a scanning control responsive to said first waveform generating means for scanning from one end of the band during the first phase and from the other end of the band during the third phase.

22. An apparatus as in claim 21, wherein said second level in each of said waveforms is insufficient to cause a visible electric discharge.

23. An apparatus as in claim 21, wherein:
said first electrode arrangement and said first plurality of electrodes forms a band; said first scanning means continuously applies the potentials to the electrodes in sequence from one end of the band toward the other until it reaches the other, and wherein said first waveform generating means includes means for establishing the first level to produce a visible electric discharge and establishes the second level to produce an electric discharge less bright than the discharge at the first level;
said second scanning means continuously applies the potentials to the electrodes in sequence from one end of the band towards the other until it reaches the other; and
said second waveform generating means includes means for establishing the first level thereof to produce a visible electric discharge and for establishing the second level thereof to produce an electric discharge less bright than the discharge at the first level thereof.

24. An apparatus as in claim 15, wherein said scanning means includes an oscillator for sequentially applying voltages to the electrodes.

25. An apparatus as in claim 17, wherein said scanning means includes an oscillator for sequentially applying voltages to said electrodes.

26. An apparatus as in claim 21, wherein said scanning means includes an oscillator for sequentially applying voltages to said electrodes.

27. An apparatus as in claim 23, wherein said scanning means includes an oscillator for sequentially applying voltages to said electrodes.

28. An apparatus as in claim 24, wherein said scanning means includes a counter for applying a number of pulses substantially equal to the electrodes.

29. An apparatus as in claim 25, wherein said scanning means includes a counter for applying a number of pulses substantially equal to the electrodes.

30. An apparatus as in claim 26, wherein said scanning means includes a counter for applying a number of pulses substantially equal to the electrodes.

31. An apparatus as in claim 27, wherein said scanning means includes a counter for applying a number of pulses substantially equal to the electrodes.

32. An apparatus as in claim 15, wherein said envelope encloses a pair of keep-alive members at each end of said plurality of electrodes and said circuit means includes means for maintaining a constant discharge between said two pairs of members;

said electrodes including two reset electrodes each between the respective keep-alive members and the remaining plurality of electrodes, said remaining plurality of electrodes being formed into three sets, each set including every third electrode of the remaining plurality of electrodes, the electrodes of each set being connected to each other;

said scanning means being connected to said three sets of electrodes and said two reset electrodes;

said scanning control energizing the reset electrode and then energizing the three sets in one sequence so as to scan from one end of the band during the first phase;

said scanning control being responsive to the waveform generating means for energizing the reset electrodes at the other end of the band and energizing the three sets in another sequence so as to scan from the other end of the band during the third phase.

33. An apparatus as in claim 21, wherein said envelopes enclose a pair of keep-alive members at each end of said plurality of electrodes and said circuit means includes means for maintaining a constant discharge between said two pairs of members;

said electrodes including two reset electrodes each between the respective keep-alive members and the remaining plurality of electrodes, said remaining plurality of electrodes being formed into three sets, each set including every third electrode of the plurality of electrodes;

said first scanning means being connected to said three sets of electrodes and said two reset electrodes;

said first scanning control energizing the reset electrode and then energizing the three sets in one sequence so as to scan from one end of the band during the first phase;

said first scanning control being responsive to the first waveform generating means for energizing the reset electrode at the other end of the band and energizing the three sets in another sequence so as to scan from the other end of the band during the third phase.

34. An apparatus as in claim 21, wherein said first waveform generating means includes means for producing a first signal corresponding to the first settable value and a second signal corresponding to the second settable value, said second waveform generating means including means for producing a third signal corresponding to the input value;

said circuit means including test means coupled to the first waveform generating means and the second waveform generating means and responsive to the first signal and the second signal and the third signal for producing an output signal when the third signal exceeds the one of the first and second signals corresponding to the higher of the settable values and when the third signal is less than the one of the first and second signals corresponding to the lower of the settable values;

said circuit means including oscillator means coupled to said first waveform generating means and said test means for repeatedly interrupting generation of the waveform for a period longer than the period of each cycle.

35. An apparatus as in claim 21, wherein the band of the plurality of electrodes are adjacent each other so that indication of one value in one band are adjacent indications of the corresponding value in the other band.

36. An apparatus as in claim 34, wherein the band of the plurality of electrodes are adjacent each other so that indication of one value in one band are adjacent indications of the corresponding value in the other band.

37. An apparatus as in claim 21, wherein said second waveform generating means includes means for establishing a low end signal corresponding to one input signal which may be applied and means for establishing an upper end signal corresponding to a higher input signal which may be applied, means for producing an indicator signal corresponding to the input value actually applied;

testing means coupled to said means for establishing the upper end signal and the lower end signal and the indicator signal for comparing the indicator signal with the lower end signal and the indicator signal with the upper end signal so as to produce an error signal when the indicator signal is less than the lower end signal and higher than the upper end signal; and said circuit means having oscillator means responsive to said test means for repeatedly interrupting generation of the waveform at a rate slower than the frequency of the multiplicity cycles.

38. An indicating apparatus, comprising:

an envelope;

a plurality of aligned operating electrodes in the envelope;

conductive means connecting said operating electrodes into a plurality of sets greater than two, the operating electrodes of each of the sets being uniformly interleaved with the operating electrodes of others of the sets, said operating electrodes forming a band;

a first reset electrode spaced from one end of the band and unconnected with any of the operating electrodes, a second reset electrode spaced from the other end of the band and unconnected with any of the operating electrodes;

an electrode arrangement within the enclosure spaced from the aligned electrodes and the reset electrodes but close enough to maintain a visible electric discharge of a given intensity when a predetermined voltage is applied between an electrode and the arrangement;

said electrode arrangement extending along the band and the reset electrodes;

first discharge gap forming means adjacent but spaced from the reset electrodes and the arrangement at one end of the band, second discharge gap forming means adjacent but spaced from the reset electrodes and the arrangement at the other end of the band, each forming means having two conductive members;

said enclosure having an ionizable gas therein;

said members in each pair being spaced from each other so that when an initiating voltage is applied between them said members can maintain a discharge continuously;

said members and said electrodes and said arrangement being spaced from each other to form an operating gap between each of said electrodes and the arrangement and so that when the predetermined voltage is applied between the arrangement and a reset electrode the discharge from the discharge gap can transfer to the operating gap between the reset electrode and the arrangement, and so that when predetermined voltages are applied sequentially to operating gaps adjacent a gap having a discharge the discharge can transfer from gap to gap;

said arrangement being composed of a single conductive strip extending from one end of the band to the other, said strip being translucent;

a second plurality of aligned electrodes in the envelope;

conductive means connecting said second plurality of operating electrodes into a plurality of sets greater than two, the operating electrodes of each of the sets being uniformly interleaved with the electrodes of others of the sets, said electrodes forming a second band;

a third reset electrode spaced from one end of the band and unconnected with any of the other electrodes;

a second electrode arrangement within the envelope spaced from the aligned operating electrodes and the reset electrodes but close enough to maintain a visible electric discharge of a given intensity when a predetermined voltage is applied between an electrode and the arrangement;

said second electrode arrangement extending along the second band and the reset electrodes;

said first gap forming means being adjacent but sapced from the third reset electrodes and the arrangement at one end of the band;

first gap forming means and said electrodes and said arrangement being spaced from each other so that said electrode arrangement forms an operating gap between each of said electrodes and the arrangement so that when the predetermined voltage is applied between the arrangement and a reset electrode a discharge at the gap forming means can transfer to the operating gap between the reset electrode and the arrangement and so that when predetermined voltages are applied sequentially to electrodes—arrangement gaps adjacent a gap having a discharge the discharge can transfer from gap to gap.

39. An apparatus as in claim 38, wherein said envelope includes a fourth reset electrode at the end of the band opposite the third reset electrode and said second gap forming means are adjacent but spaced from said fourth reset electrode.

40. An apparatus as in claim 38, wherein said arrangement is composed of a single conductive strip extending from one end of the band to the other.

41. An apparatus as in claim 38, wherein said conductive members in said first gap forming means extend adjacent to said third reset electrode.

42. An apparatus as in claim 39, wherein said conductive members in said first and second gap forming means extend adjacent to said third and fourth reset electrodes respectively.

43. An apparatus as in claim 38, wherein the first and second bands are aligned parallel to each other.

44. An apparatus as in claim 43, wherein the electrodes in one band are spaced from each other the same distance as in the other band.

45. An indicating apparatus comprising:

a display including an enclosure having an ionizable gas therein, a plurality of electrodes aligned in the enclosure, an electrode arrangement within the enclosure spaced from the aligned electrodes but close enough to maintain a visible electric discharge of a given intensity when a predetermined voltage is applied between an electrode and the arrangement, and discharge initiating means spaced from the electrodes for producing the conditions when energized, for producing the discharge with the predetermined voltage; and circuit means responsive to settable values and coupled to the electrodes and the electrode arrangement for generating a multiplicity of cycles, and for generating within each cycle a first potential between the electrode arrangement and sequential ones of the electrodes extending over a distance corresponding to the first settable value, and for generating within each cycle at least one second potential between the arrangement and the other sequential ones of the electrodes extending over a distance corresponding to the difference between the first value and the second value, and for generating within each cycle the first potential between the electrode arrangement and remaining sequential ones of the electrodes, one of the potentials being equal to the predetermined discharge voltage;

said circuit means including energizing means for energizing said indicating means.

46. An indicator, comprising:

a display and a circuit coupled to the display;

said display including an envelope containing an ionizable gas, a plurality of aligned electrodes within the envelope and forming a band, an electrode arrangement spaced from the electrodes within the envelope;

each of said electrodes forming a gap with a portion of the arrangement, the gap forming a discharge path for a visible electric discharge of a given intensity when both the electrodes and the gap and the arrangement are each simultaneously subject to an enabling condition by application of a predetermined discharge voltage across the gap, an electrode and the arrangement both being subject to a non-enabling condition by application of a voltage less than the predetermined discharge voltage, an electrode and the arrangement each being subject to an enabling condition by application of respective potentials producing the discharge voltage;

said circuit including electrode operating means coupled to said electrodes for applying an enabling condition to sequential ones of the electrodes in sequence, arrangement operating means coupled to said arrangement for applying enabling conditions to said arrangement;

said circuit including control means responsive to two settable values and coupled to said electrode operating means and said arrangement operating means for constraining said operating means to apply one of the conditions to sequential ones of the electrodes and the arrangement simultaneously over two sections of the band, one of which extends over a distance corresponding to one of the values and is separated from the other section by a distance corresponding to the difference between the two values.

47. An indicator for exhibiting an analog representation of a test value and two settable limit values, comprising:
   display means having a first and second plurality of illuminating means forming first and second adjacent bands, said illuminating means being energizable to exhibit one of a plurality of intensities of illumination;
   first circuit means responsive to the test value and coupled to the illuminating means for energizing the illuminating means so that adjacent ones of the illuminating means exhibit an intensity of illumination over a portion of the band corresponding to the test value;
   second circuit means responsive to the two limit values and coupled to the illuminating means in said second band for energizing said illuminating means so that adjacent illuminating means along two separate portions, one of whose length represents one of the limit values, exhibits a given intensity of illumination, and said illuminating means and a third portion, whose length represents the difference of the two limit values, and which extends between the two portions exhibit another intensity perceptibly different from the given intensity.

48. An apparatus as in claim 47, wherein one of said circuit means includes a timing generator for generating a successive plurality of timing cycles, said timing means being coupled to the other of said circuit means, said first circuit means including scanning means coupled to said timing means for successively energizing said illuminating means in sequence from one end of the band to the other within each cycle so that the given ones of the illuminating means exhibiting the one intensity exhibit that one intensity when energized in sequence;
   said second circuit means including second scanning means coupled to said timing means and said second plurality of illuminating means for sequentially energizing said second plurality of illuminating means in each portion so that only one of said illuminating means at a time exhibit the given intensity.

49. An apparatus as in claim 47, wherein each of said illuminating means includes at least a portion of two electrodes forming a gap and a discharge path between the gap.

50. An apparatus as in claim 48 wherein each of said illuminating means includes at least a portion of two electrodes forming a gap and a discharge path between the gap.

51. An apparatus as in claim 49, wherein said display means includes initiating means at one end of the first band of illuminating means and second and third initiating means at each end of the second band of illuminating means;
   said initiating means each including a pair of electrodes, said circuit means each energizing said electrodes continuously so as to provide a continuous discharge and a continuous source of metastable ions at the electrodes, said illuminating means at the one end of the first band and the two ends of the second band being sufficiently close to one of the initiating means so that application by said circuit means of a predetermined potential shifts the discharge to the illuminating means and subsequent scanning shifts the discharge from one illuminating means to adjacent illuminating means.

52. An apparatus as in claim 51, wherein said first circuit means energizes the first illuminating means so that the portion of the band corresponding to the test value is adjacent the initiating means and produces the one intensity greater than the other intensity;
   said second circuit means energizing the illuminating means so that the two separate portions exhibit an intensity greater than the intermediate portion;
   said scanning means scanning first one separate portion from the initiating means at one end of the second band and thereafter sequentially scanning the illuminating means from the initiating means at the other portion of the band.

53. An apparatus as in claim 52, wherein the electrodes in said illuminating means between the illuminating means at the ends of the bands are connected in a plurality of interleaved phases greater than two and said second scanning means connects each phase in sequence so as to shift the discharge from one illuminating means to the next over a time period corresponding to one limit value, and when the one limit value is reached shifts the discharge to the illuminating means at the other end of the band and shifts the phase so as sequentially to discharge the illuminating means from the other end of the band.

54. An indicator comprising, a display and a circuit; said display having a first plurality of electrodes forming a band, a second plurality of electrodes forming a band, a first counter electrode extending along the first band and spaced from the electrodes, a second counter electrode extending along a second band and spaced from the electrodes, one of the electrodes at the end of the first band being a reset electrode, the electrodes at the end of the second band being reset electrodes, the remaining electrodes in said first band being interconnected in three interleaved phases so that every electrode is connected to every third electrode therefrom, said electrodes of said second band being interconnected in three interleaved phases so that every electrode is connected to every third electrode therefrom, a pair of keep-alive electrodes adjacent each of said reset electrodes, envelope means surrounding said bands and said counter electrodes, an ionizable gas in said envelope, said first plurality of electrodes forming successive gaps between each of said electrodes and the counter electrode, said second plurality of electrodes forming successive gaps between each of said electrodes and the counter electrodes;
   said circuit including timing means defining a plurality of successive cycles, energizing means for energizing said keep-alive electrodes so as to initiate and maintain a visible discharge between said pairs of keep-alive electrodes,
   first electrode operating means connected to said electrodes in said first band for applying a predetermined potential to the reset electrode at one end of the first band and then repeatedly to the phases in succession starting with the phase having an electrode closest to the reset electrode and then next-to-closest so that the predetermined potential is applied sequentially to the electrodes along the band, first circuit means responsive to the test value and coupled to said timing means as well as said first counter electrode for applying to said first counter electrode a counter-electrode operating potential over a period of time within each cycle corresponding to the test value, said first potential and said second potential being sufficient to produce a visible discharge between an electrode and the first counter electrode when a discharge exists in an adjacent gap or between adjacent keep alive electrodes, second circuit means coupled to said timing means and said second counter electrode and responsive to two settable limit levels for applying an energizing potential during each cycle to said second counter electrode for a first period of time corresponding to the lower of the two limit levels and after a period of time corresponding to the difference of the two limit levels again applying the energizing potential to said second counter electrode, second electrode operating means coupled to said timing means and to said second circuit means as well as to said second plurality of electrodes for applying a given potential to the reset electrode at the end of the band nearest the reset electrode on the first band and then sequentially to the successive phases as they depart in distance from the last-mentioned reset electrode on the second band, said second electrode operating means including reversing means responsive to one of the reset levels for applying the given potential to the second reset electrode in said second band and thereafter reversing the phases have the given potential applied to them so that the given potential is applied in sequence from the second reset electrode in the second band in response to the higher of the limit levels, said energizing potential and said given potential together being sufficient to shift the discharge from a gap between the keep-alive electrodes or other adjacent gaps when the potentials are simultaneously applied to one of the second electrodes and the second counter electrode, said second circuit means and said second electrode operating means otherwise applying potentials insufficient to shift and maintain discharge;

said bands being parallel and laterally opposed to each other.

* * * * *